(12) United States Patent
Kaiser

(10) Patent No.: US 6,756,578 B1
(45) Date of Patent: Jun. 29, 2004

(54) PHOTOCELL BIAS CIRCUIT

(75) Inventor: Timothy David Kaiser, Beavercreek, OH (US)

(73) Assignee: Trimble Navigation Limited, Sunnyvale, CA (US)

( * ) Notice: Subject to any disclaimer, the term of this patent is extended or adjusted under 35 U.S.C. 154(b) by 30 days.

(21) Appl. No.: 10/051,793

(22) Filed: Jan. 17, 2002

(51) Int. Cl.$^7$ .............................................. H01J 40/14
(52) U.S. Cl. ............................ 250/214.1; 250/214 A; 250/214 LA; 250/214 R; 327/514
(58) Field of Search ........................ 250/214 A, 214 LA, 250/214 R, 214.1; 330/59, 308, 309; 356/221, 226; 327/514

(56) References Cited

U.S. PATENT DOCUMENTS

| | | | |
|---|---|---|---|
| 4,190,747 A | | 2/1980 | Feiner et al. |
| 4,292,514 A | * | 9/1981 | Ohtomo ................... 250/214 C |
| 4,536,715 A | | 8/1985 | Basarath et al. |
| 4,805,236 A | | 2/1989 | Urala |
| 4,939,476 A | | 7/1990 | Crawford |
| 5,008,524 A | | 4/1991 | Reutter et al. |
| 5,012,202 A | | 4/1991 | Taylor |
| 5,023,951 A | | 6/1991 | Kahn |
| 5,030,925 A | | 7/1991 | Taylor |
| 5,198,658 A | | 3/1993 | Rydin |
| 5,252,820 A | | 10/1993 | Shinomiya |
| 5,296,697 A | * | 3/1994 | Moses, Jr. ................ 250/214 R |
| 5,432,470 A | | 7/1995 | Sasaki |
| 5,578,815 A | * | 11/1996 | Nakase et al. ........... 250/214 R |
| 5,763,873 A | | 6/1998 | Beck et al. |
| 5,786,730 A | | 7/1998 | Hadley |
| 5,798,670 A | | 8/1998 | Lee |
| 6,031,219 A | | 2/2000 | Shuke |
| 6,137,101 A | | 10/2000 | Yokogawa et al. |
| 6,307,196 B1 | * | 10/2001 | Thompson et al. ...... 250/214 A |
| 6,342,694 B1 | * | 1/2002 | Satoh ....................... 250/214 A |
| 6,396,614 B1 | * | 5/2002 | Yoshizawa ............... 250/214 A |
| 6,426,494 B1 | * | 7/2002 | Kiyota ..................... 250/214 R |
| 6,525,305 B2 | * | 2/2003 | Deschamps et al. ..... 250/214 R |

OTHER PUBLICATIONS

An Applications Guide for Op Amps, National Semiconductor Application Note 20, Feb. 1969, National Semiconductor Corporation 1995, 1–12.

* cited by examiner

Primary Examiner—Christopher W. Fulton
Assistant Examiner—Madeline Gonzalez
(74) Attorney, Agent, or Firm—Dinsmore & Shohl LLP

(57) ABSTRACT

Receiver circuits are provided for detecting a target light source. The circuits include a photocell arranged to detect light impinging thereupon, and a biasing circuit that maintains a constant reverse voltage across, the photocell irrespective of the photocell output. This maintains the capacitance of the photocell at a substantially constant value, and results in faster response times from the photocell. Further, the present invention provides circuits for effectively removing ambient conditions such as daylight from the output. Also, the present invention reduces the amount of signal loss between the photocell output and an amplifier due to loading at the input stage of the amplifier.

9 Claims, 3 Drawing Sheets

PHOTOCELL BIAS CIRCUIT

BACKGROUND OF THE INVENTION

The present invention relates in general to a light detecting and amplifying circuit and in particular to a light detecting circuit that provides solar cancellation.

Photocells are devices that produce an output current generally proportional to the irradiance of the light impinging thereon. As such, photocells provide a convenient means to measure the intensity of electromagnetic radiation in the visible and infrared regions. However, the output signal generated by the photocell is typically weak; thus some sort of amplification and/or signal conditioning is used before further processing of the output current by additional signal processing circuitry.

Photocells generally comprise an intrinsic depletion layer sandwiched between an n-type doped region (the cathode) and a p-type doped region (the anode). If the photocell is reverse biased (a positive voltage applied from the cathode to the anode), the depletion area increases and the capacitive effects of the photocell decrease. A typical reverse bias light receiving circuit 10 is illustrated in FIG. 1. Light impinging on the photocell 12 causes a current ($I_{PC}$) 14 to flow from the anode of the photocell 12 into the load resistor (RL) 16. The current 14 is typically weak and varies depending upon the intensity of light on the photocell. The load resistor 16 is provided to convert the current 14 into a voltage ($V_{PC}$) 20. Further, amplifier 22 is provided to amplify the voltage across the load resistor 16.

Photocells typically exhibit a parasitic capacitance that can be expressed by the well-known formula:

$$C = \frac{\varepsilon_s A}{x_T}$$

Where $\varepsilon_s$ is the permitivity of substrate, A is the junction area, and $X_T$ is the width of the depletion region.

It is desirable to minimize this capacitance to improve the speed and response time of the photocell. It should be clear from the above formula that increasing the width of the depletion region of the photocell reduces the parasitic capacitance. This is accomplished by applying a reverse voltage between the cathode and anode. As such, a bias voltage ($V_{Bias}$) 18 is applied to the cathode of the photocell.

As a practical matter, the selection of a value for the load resistor 16 can prove a limiting factor in the circuit performance. For example, the load resistor 16 forms a parallel circuit with the input impedance of the amplifier 22. An appreciable amount of the output of the photocell 12 can thus be lost across the load resistor 16 due to loading effects if the resistance value of the load resistor 16 is chosen too small. The amount of signal loss due to the loading effects of the load resistor 16 is the percentage of the load resistor 16 in parallel with the transimpedance gain of the amplifier 22. On the other hand, higher resistance values result in higher resistor thermal noise, which can compromise the accuracy of the output by the photocell 12, especially when the output current is weak. Also, the higher the value of the load resistor 16, the more limited the dynamic range of the photocell 12. This is seen by the observation that should the voltage 20 across the load resistor 16 (computed from Ohm's law as the photocell output current 14 times the resistance value of the load resistor 16), exceed the bias voltage 18, the photocell 12 will no longer be reverse biased, and the capacitance of the photocell increases. To prevent this from happening, the bias voltage 18 is known to exceed 50 volts in some applications. Such a solution is inefficient, especially when designing the circuit for battery powered portable devices.

Another disadvantage of the prior art circuit of FIG. 1 lies in the observation that the reverse voltage between the cathode and anode of the photocell, and thus the parasitic capacitance of the photocell, changes as the intensity of light impinging on the photocell changes. The reverse voltage that biases the photocell is the bias voltage 18 minus voltage 20 across the load resistor 16. As pointed out above, as light intensity impinging on the photocell 12 increases, the photocell output current 14 increases, and thus the voltage 20 increases. This lowers the effective reverse voltage, and thus increases the capacitance of the photocell. As a result, response time of the photocell can become sluggish and the photocell may become ineffective at capturing short duration pulses of light.

Yet another disadvantage of the circuit of FIG. 1 is that any noise in the power supply that provides the bias voltage 18 is seen as an output of the photocell 12 and amplified by the amplifier 22.

Accordingly, there is a need for a circuit that provides a constant reverse voltage to a photocell. Further, there is a need for a circuit that can maintain the constant reverse voltage by using a low voltage supply.

SUMMARY OF THE INVENTION

The present invention overcomes the disadvantages of previously known receiver circuits by providing a circuit that maintains a constant reverse voltage across one or more photocells. This maintains the capacitance of the photocell at a substantially constant value, and fast photocell response times are realized. Further, the present circuits reduce the amount of signal loss due to loading at the input stage of the amplifier, and effectively remove noise, including ambient conditions such as daylight.

In accordance with one embodiment of the present invention, a single operational amplifier is used to maintain a photocell at a constant reverse voltage. The photocell is connected to the circuit such that the anode is coupled to ground, and the cathode is tied to the inverting input of an operational amplifier (op-amp). The non-inverting input of the op-amp is tied to a reference voltage, which is adjusted to the desired bias voltage. Further, an inductor is provided in a negative feedback loop between the inverting input and output of the op-amp. The photocell is also coupled to a transimpedance amplifier through a capacitor. The inductor is seen by the photocell as a low impedance load for low frequency signals. Thus, the effects of daylight, which are observed by the photocell as d.c. or low frequency signals are, effectively buffered. Further, the photocell sees the inductor as a high impedance load at high frequencies. Thus a substantial portion of the signal of interest from the photocell is delivered to the transimpedance amplifier.

According to another embodiment of the present invention, a photocell is connected to the circuit such that the anode is coupled to ground, and the cathode is tied to the inverting input of an operational amplifier (op-amp). The non-inverting input of the op-amp is tied to a reference voltage, which is adjusted to the desired bias voltage. Further, a parallel combination of an inductor and a capacitor is provided in a negative feedback loop between the inverting input and output of the op-amp. The photocell is also coupled to a transimpedance amplifier through a capacitor.

The parallel combination of the inductor and capacitor are tuned such that the feedback loop of the op-amp provides a high impedance load at frequencies of interest. Thus a substantial portion of the signal from the photocell is delivered to the transimpedance amplifier. Further, the parallel combination of the inductor and capacitor provide a low impedance load at frequencies of no interest. The inductor is seen by the photocell as a low impedance load for low frequency signals. Thus the effects of daylight, which are observed by the photocell as d.c., or low frequency signals are effectively buffered by the inductor. The capacitor placed in parallel with the inductor is seen by the photocell as a low impedance load for very high frequency signals. Thus high frequency noise is effectively buffered and reduced from appearing at the output of the transimpedance amplifier.

It is thus an object of the present invention to provide a circuit that supplies a photocell constant reverse voltage that remains substantially constant, irrespective of the photocell output current.

It is an object of the present invention to provide a circuit that actively filters the effects of daylight from the receiver.

It is an object of the present invention to provide a circuit that buffers the output current from the photocells when the output comprises frequencies of no interest.

It is an object of the present invention to provide a circuit having a very high impedance buffer at the frequencies of interest such that there is minimal signal loss in the transfer of the signal of interest from the photocell to the amplifier.

Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

Figure 2:
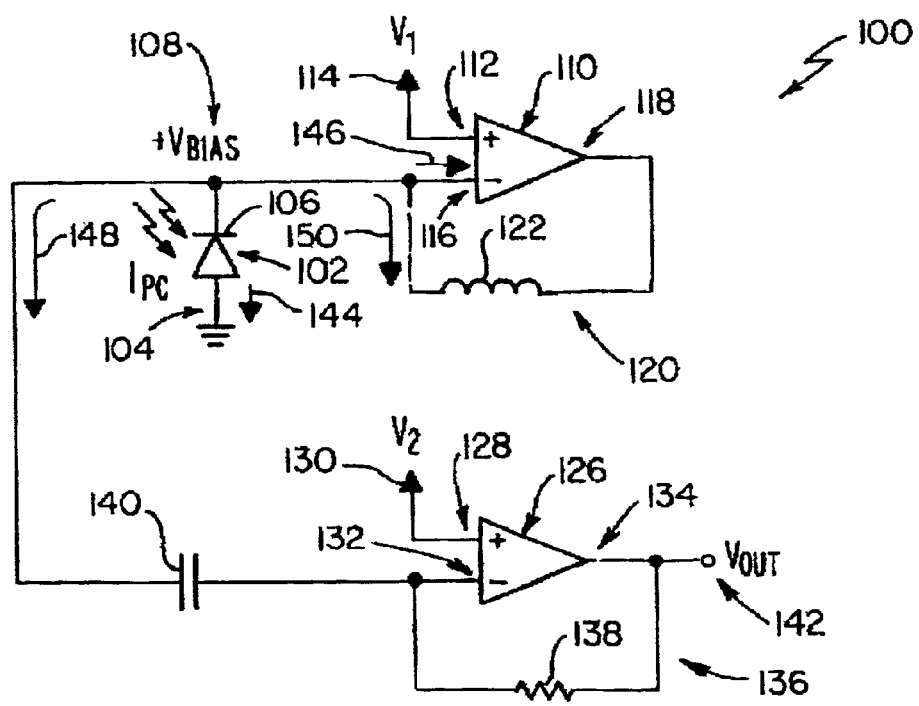
FIG. 2 is a schematic illustration of a receiver circuit according to one embodiment of the present invention.

Referring to FIG. 2, an improved circuit 100 for a laser receiver is illustrated. A light detector 102, such as a photocell, comprises a photodiode having an anode 104 coupled to ground potential, and a cathode 106 coupled to a bias voltage $(+V_{Bias})$ 108. The light detector 102 outputs a current $I_{PC}$ based upon the intensity of light measured thereby.

A first operational amplifier (op-amp) 110 comprises a non-inverting input 112 coupled to a first reference voltage $(V_1+)$ 114, and an inverting input 116 coupled to output 118 by a negative feedback loop 120. The negative feedback loop 120 includes an inductor 122. The inverting input 116 is also coupled to the cathode 106 of the light detector 102.

A second op-amp 126 comprises a non-inverting input 128 coupled to a second reference voltage $(V_2+)$ 130, and an inverting input 132 that is coupled to output 134 by a negative feedback loop 136. The negative feedback loop 120 includes a resistor 138. The inverting input 132 is also coupled to the cathode 106 of the light detector 102 through capacitor 140. The output signal or voltage output $(V_{out})$ 142 of the circuit 100 is measured across the output 134 of the second op-amp 126.

The value of the second reference voltage $(V_2+)$ 130 will depend upon the type of op-amps used. For example, if the second op-amp 126 includes both positive and negative supply voltages, the second reference voltage $(V_2+)$ 130 may be tied to ground potential. Where the power supplied to the second op-amp 126 comprises a single positive voltage, then the second reference voltage $(V_2+)$ 130 is selected somewhere between ground potential and the supply voltage. For example, the second op-amp 126 is typically powered by a +5 volt supply. Under such an arrangement, the second reference voltage $(V_2+)$ 130 is selected somewhere between +5 volts and ground potential, such as 2.5 volts. It may also be convenient to set the second reference voltage $(V_2+)$ 130 equal to the first reference voltage $(V_1+)$ 14. For example, where the first reference voltage $(V_1+)$ 114 is 2 volts, setting the second reference voltage $(V_2+)$ 130 to 2 volts simplifies circuit design. Further, because the signal is going to have a mostly positive output, increased positive headroom is realized.

The operation of the circuit 100 will now be described for an exemplary application in the field of surveying. In a typical surveying application, a laser transmitter or other illuminated target produces a beam of coherent light that repeatedly sweeps across a target area. The circuit 100 is positioned within the target area, and the light detector 102 is used to sense the presence of the light. One or more photocells are well suited for use as the light detector 102 in this application because a typical photocell outputs a current that is proportional to, or at least related to the intensity of light that impinges thereupon, and generally has low internal noise and intrinsically fast response times thus allowing the measurement of very short light pulses. Essentially, the photocell detects the amplitude variations of light impinging thereon, and must be capable of detecting spectral frequencies within a predetermined frequency range that corresponds to the beam of coherent light that sweeps across the target area.

The portion of the circuit 100 defined by the first op-amp 110 provides two functions. The first reference voltage $(V_1+)$ 114 in combination with the first op-amp 110 provides a constant bias circuit arranged to maintain the light detector 102 in a reverse biased state such that a reverse voltage (a voltage having a positive polarity when measured from the cathode 106 to the anode 104) remains substantially constant irrespective of the output signal generated by the light detector 102. Also, the first op-amp 110 and negative feedback loop 120 define a signal filter or first variable impedance load that serves as a buffer for the output current of the light detector 102. The signal filter performs the task of filtering the measured light having spectral frequencies detected outside the predetermined frequency range such that noise and ambient light conditions are substantially attenuated, or ignored.

The constant bias circuit takes advantage of the principle of the virtual short circuit for ideal op-amps. That is, the voltage between the non-inverting input 112 and the inverting input 116 is ideally zero volts. This means that the first reference voltage ($V_1+$) 114 applied to the non-inverting input 112 will appear at the inverting input 116. Because the inverting input 116 is tied to the cathode 106 of the light detector 102, the first reference voltage ($V_1+$) 114 provides the bias voltage to the light detector 102. That is, under steady state conditions, the bias voltage ($+V_{Bias}$) 108 is substantially equal to the first reference voltage ($V_1+$) 114. Because the anode 104 of the light detector 102 is tied to ground, the bias voltage ($+V_{Bias}$) 108 maintains a constant reverse bias across the light detector. As the light detector 102 begins to output current in response to detected light, the inverting input 116 serves to maintain and drive the bias voltage ($+V_{Bias}$) 108 to maintain a substantially constant value determined by the first reference voltage ($V_1+$) 114.

The constant reverse bias across the light detector 102 allows the size of the depletion region of the light detector 102, and thus the parasitic capacitance of the light detector 102, to be maintained at substantially constant and relatively low values. The capacitance of the light detector 102 affects the response time of the light detector 102, and hence the response time of circuit 100. By maintaining the capacitance of the light detector 102 at a substantially constant value, the response time of the circuit will remain predictable irrespective of the intensity of the light impinging upon the light detector 102. Further, the parasitic capacitance of the light detector 102, and thus the dynamic range of the light detector 102, can be tuned to obtain specific performance characteristics by varying the first reference voltage ($V_1+$) 114.

The present invention can achieve suitable performance with the bias voltage ($+V_{Bias}$) 108 set to relatively low voltage levels. The voltage level may even be within the power supply rails of the op-amp 110. For example, the first reference voltage ($V_1+$) 114 can be set to a voltage less than 5 volts, and in one embodiment, the first reference voltage ($V_1+$) 114 is set to a value around 2 volts. Thus it is practical to use circuit 100 in battery powered circuits that have significantly improved operational times between battery changeovers. It will be observed that the present invention does not rely on a load resistor in series with the anode of the light detector to measure the output current of the light detector, as required by the prior art. Thus, with the circuit of the present invention, the large voltages required by the prior art to maintain the light detector in a reverse biased state are no longer necessary.

The first reference voltage($V_1+$) 114 is preferably selected as a voltage within the power supply rails of the op-amp 110. Accordingly, the power supply rejection ratio, or power supply noise rejection of the first op-amp 110, serves to condition and buffer the first reference voltage ($V_1+$) 114 appearing at the inverting input 116. This conditioning provides a reference voltage (the bias voltage ($+V_{Bias}$) 108) that is stable and less susceptible to noise, ripple, and other adverse effects. Thus, the effects of the noise are minimized before the noise reaches the second op-amp 126.

In operation, first assume that no light is incident on the light detector 102. Under this condition, the light detector 102 does not output any current, and the bias voltage ($+V_{Bias}$) 108 is maintained at a constant direct current (d.c.) voltage substantially equal to the first reference voltage ($V_1+$) 114. At d.c., the capacitor 140 is saturated and thus modeled by an open circuit. Thus, the second op-amp 126 is effectively isolated from the light detector 102.

In typical use, however, the light detector 102 will be exposed to daylight. The circuit 100 must therefore discriminate between the current output by the light detector 102 representing the intensity of the daylight, and the current produced by the intensity of the laser light that impinges upon the light detector 102. In other words, the ambient daylight represents a signal of no interest, and the laser light represents a signal of interest.

Ambient daylight impinging upon the light detector causes the light detector to produce a fairly steady d.c. current output, or at least a very low frequency output. For example, on a clear day, the sun shines all the time, thus the light impinging on the light detector 102 will remain substantially constant over the time that the device is operating. As such, the sunlight will "look" generally like a d.c. current output by the light detector 102. On a cloudy day, or in less than perfect environmental conditions, the intensity of the ambient light may change, but the change happens gradually over the course of long periods of time relative to the time upon which the laser impinges the light detector 102. Thus the effects of ambient daylight under these conditions will still "look" like d.c. current, or low frequency current, for example on the order of a few hertz or less.

The swept laser impinges on the light detector 102 periodically during short Intervals of time. Thus the light detector 102 will output a current signal representing the laser and having relatively high spectral frequencies in comparison to the background light. For example, the laser component of the output of the light detector 102 may have a frequency that is on the order of 100 kilohertz, and even into the megahertz range. As such, the output of the light detector 102 will generally have two components. A slowly varying, or d.c. component representing the ambient light, and an alternating current (a.c.) component representing the laser light (which is the component of interest).

When the circuit 100 is exposed to ambient light, the light detector 102 will output a current signal representing the intensity of the measured light. As explained above, this signal approximates a d.c. signal, or low frequency signal. There are essentially only four paths for the current output by the light detector 102 to travel. The first direction 144 is a path to ground, and negligible current will flow in this direction.

The second direction 146 is into the inverting input 116 of the first op-amp 110. Based upon the principle of the virtual short circuit, the current entering either the non-inverting input 112 or the inverting input 116 of the op-amp 110 is zero, thus negligible current enters the inverting input 116.

The third direction 148 that the current can flow is towards the second op-amp 126. As pointed out above, the capacitor 140 looks like an open circuit to d.c. signals. At low frequencies, the capacitive reactance of the capacitor 140 is large. Therefore the input impedance looking into the second op-amp 126 is large. The capacitor 140 and the op-amp 126 thus appear as a high impedance load, and negligible current travels in the third direction.

The fourth direction 150 is essentially a path through the feedback path 120 of the first op-amp 110. The op-amp 110 and negative feedback path 120 simulate an inductive load for the light cell 102. The inductor 122 is modeled as a short circuit for d.c. signals. At low frequencies, the inductive reactance of the inductor 122 is small and the inductor appears as a very small impedance. The output 118 of the first op-amp also has a low impedance.

The signals from the light detector 102 that represent typical ambient daylight conditions, or signals of no interest, see an open circuit in the case of d.c. signals, and a very high impedance in the case of low frequency a.c. signals when looking in the third direction 148, and a low impedance looking in the fourth direction 150. As such, the current output by the light detector 102 in response to ambient sunlight is substantially diverted to, or buffered by, the feedback path 120 of the first op-amp 110, and is substantially attenuated. The first op-amp 110 is typically capable of handling relatively high current levels. Thus the first op-amp 110 can satisfactorily accommodate the current output across the entire dynamic range of the light detector 102.

As the laser light is swept and momentarily impinges upon the light detector, the current output by the light detector 102 representing the laser light component looks like a relatively high frequency a.c. signal, and represents a signal of interest. Negligible current will travel in the first and second directions 144, 146 for reasons stated above. At relatively high frequencies, the capacitive reactance of the capacitor 140 is small, thus the third direction 148 "sees" a low impedance load. Likewise, at relatively high frequencies, the inductive reactance of the inductor 122 is large, thus the fourth direction 150 "sees" a high impedance load. As such, a majority of the signal of interest will couple to the second op-amp 126. As such, the circuit 100 provides a very high impedance buffer (negative feedback loop 120) at the frequencies of interest such that signal loss in the transfer of the signal of interest from the light detector 102 to the op-amp 126 is minimized. Thus the output of the light detector 102 is not substantially attenuated for signals having a spectral frequency within a predetermined frequency range.

Figure 1:
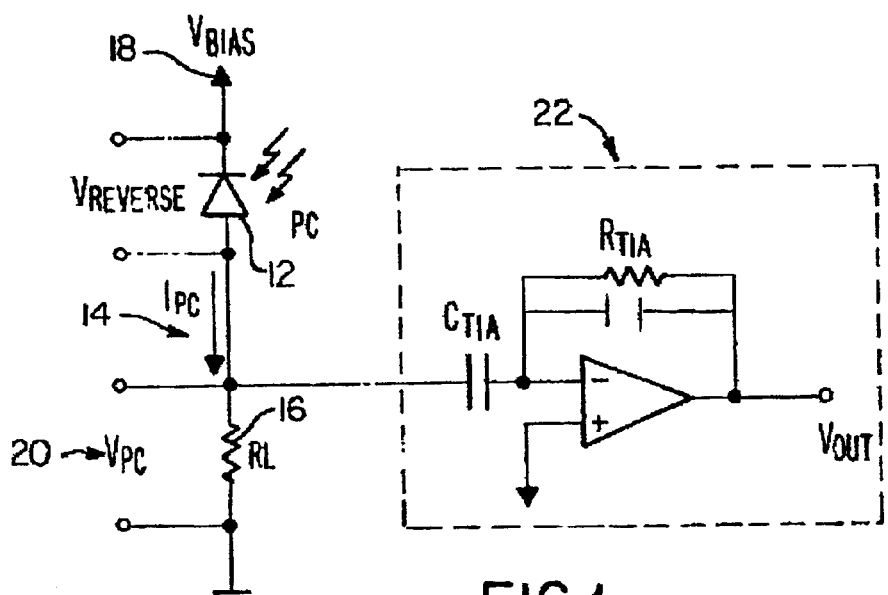
FIG. 1 is a schematic illustration of a receiver circuit according to the prior art.

The second op-amp 126 is configured to act as a transimpedance amplifier. The second op-amp 126 converts the output current representing the signal of interest into an output voltage, and provides amplification to the signal of interest through resistor 138 in the negative feedback loop 136. The output of the transimpedance amplifier will comprise a sequence of voltage pulses corresponding to laser pulses detected by the light detector 102. It will be appreciated that this output voltage can then be sent to any one of various configurations of processing circuitry. The present invention provides improved sensitivity over the prior art use of a load resistor in series with the anode of the light detector because in the present invention, a substantial portion of the signal output by the light sensor 102 is delivered to the transimpedance amplifier. In the prior art, a portion of the signal is lost by the percentage of the load resistor in parallel with the transimpedance gain of the amplifier circuit, as illustrated in FIG. 1.

The output of the transimpedance amplifier is the output current of the light detector (denoted schematically in FIG. 2 as $I_{PC}$) times the resistance value of resistor 138 in the negative feedback loop 136 of the second op-amp 126. As the feedback resistance of the transimpedance amplifier is varied, both the gain of the amplifier and the circuit bandwidth changes. As the feedback resistance increases, stray capacitance across resistor 138 and capacitance from the light detector 102 increasingly limits the maximum high frequency bandwidth of the circuit 100. However, at low feedback resistance, the combined effect of the phase shift of the second op-amp 126 operating as an inverting amplifier, the phase shift caused by the capacitance of the light detector 102, and feedback resistance of resistor 138 cause a peak in the frequency response of the transimpedance amplifier circuit. As the gain is reduced, the circuit may be driven into oscillation.

Figure 3:
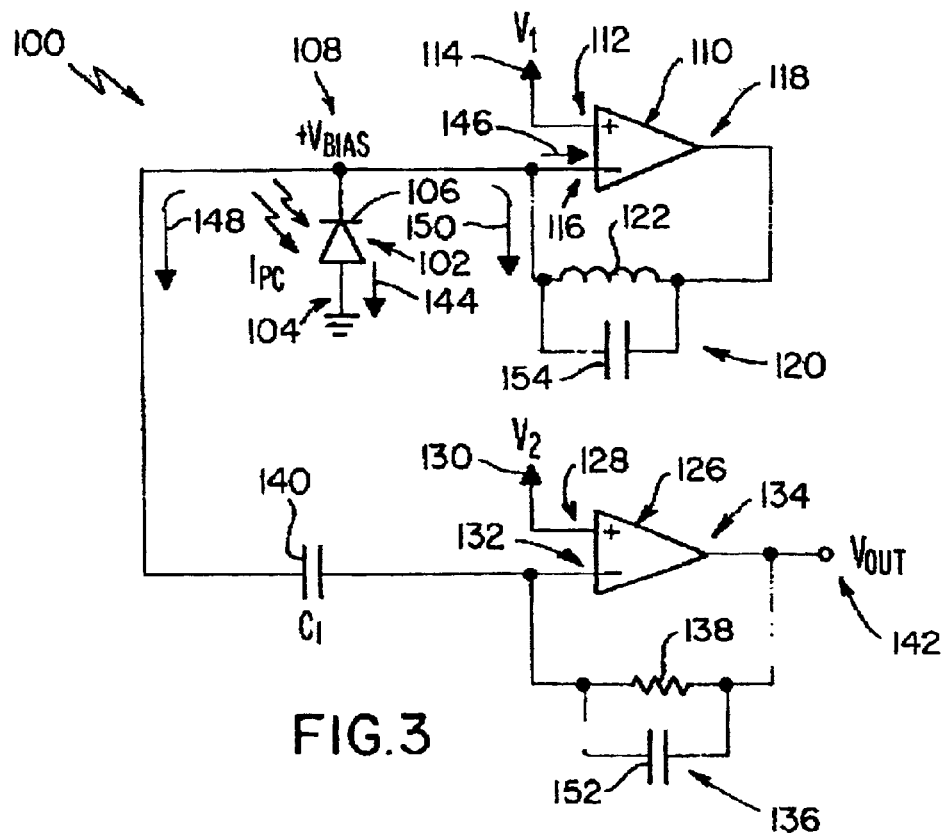
FIG. 3 is a schematic illustration of a receiver circuit according to another embodiment of the present invention.

Referring to FIG. 3, where like structure is indicated with like reference numerals, an optional capacitor 152 is positioned in parallel with resistor 138 in the negative feedback loop 136 of the second op-amp 126. The capacitor 152 is used to reduce or eliminate the threat of oscillation in the transimpedance circuit. The capacitor 152 reduces the phase shift at the unity loop gain frequency. The value of capacitor 152 is determined from the capacitance of the light detector 102, the input capacitance of the second op-amp 126, the open-loop gain/bandwidth product of the second op-amp 126, the value of resistor 138, and preferably from other stray capacitances in the circuit design. Some consideration must be placed in the selection of the value of the capacitor 152. If the value of the capacitor 152 is selected too large, the bandwidth of the circuit 100 may be unnecessarily limited. If the capacitance is too small, the frequency response of the op-amp 126 may contain an undesirable spike. As an alternative to providing capacitor 152, a faster op-amp having a higher frequency first pole in its open loop gain characteristics may be used.

It will be observed that the bias voltage ($+V_{Bias}$) 108 is maintained at a constant d.c. voltage, thus the parasitic capacitance seen across the light detector 102 remains constant. The noise gain of the second op-amp 126 is derived in part, from this parasitic capacitance. Thus, the noise gain structure of the second op-amp 126 remains constant throughout the operational range of the light detector 102. Referring back to FIG. 1, with prior art circuits such as that described with reference to FIG. 1, the noise gain structure of the amplifier 22 is variable, and is derived from the parasitic capacitance of the photocell 12 divided by the capacitance in the feedback loop of the amplifier 22. At the bias voltage minimum, the parasitic capacitance of the photocell 12 is large, thus the noise gain is at a maximum value. Conversely, as the bias voltage increases, the capacitance of the photocell 12 decreases, thus the noise gain structure of the amplifier 22 decreases.

Referring back to FIG. 3, the present invention can maintain a high bandwidth over all frequencies of interest, and thus allows for faster response times over the prior art. As pointed out, the bias voltage ($+V_{Bias}$) 108 is a constant d.c. voltage, thus the parasitic capacitance of the light detector 102 remains constant. As such, there is no delay caused by the need to recharge the parasitic capacitance of the light detector 102 in response to light impinging thereon. In prior art circuits such as that described with reference to FIG. 1, the capacitance of the photocell changes as the bias voltage changes. The need to recharge the photocell 12 thus causes limitations in the bandwidth of the circuit.

As shown in FIG. 3, an optional capacitor 154 is placed in parallel with inductor 122 in the negative feedback loop 120 of the first op-amp 110. At very low frequencies, the inductive reactance of the inductor 122 is small and the inductor 122 appears as a very small impedance. At very high frequencies, the capacitive reactance of the capacitor 154 is small and the capacitor 154 appears as a very small impedance. The inductor 122 and capacitor 154 in parallel form a tuned circuit having a computable center frequency, and the negative feedback loop 120 of the first op-amp 110 appears as a small impedance load both at low and high frequencies with respect to the tuned center frequency. As such, the negative feedback loop 120 forms a circuit that can be designed to notch at the target frequency of the laser light such that the negative feedback loop 120 appears to the light detector 102 as a low impedance load except for the frequency band of the laser light. At that frequency band, the negative feedback loop 120 appears to the light detector 102 as a high impedance load. The center frequency of the LC circuit and the determination of the pole Q factor are easily determined by well-known formulas.

There are numerous advantages to this configuration. The capacitor 154 allows the negative feedback loop 120 to appear as a low impedance load to very high frequencies, and thus serves to filter high frequency noise in addition to the low frequency and d.c. ambient conditions. The pole-Q determines how narrow (selective) the bandpass filter defined by the LC circuit of inductor 122 and capacitor 154 is. Specifically, as Q increases, the bandwidth decreases and the filter becomes more selective. As such, the negative feedback loop 120 can be tuned to look like a high impedance load to the light detector 102 only for a narrow band of frequencies that corresponds to the expected frequency range of the laser light source.

For example, in applications where it is desirable to filter out ambient conditions such as the effects of daylight, the negative feedback loop 120 may be configured to provide low pass filtering of DC, and low frequency component signals. For example, a lowpass filter cutoff between 10 Hertz and 50 Hertz may provide suitable results. However, it will be appreciated that the application will dictate the cutoff frequency, or the frequencies at which the negative feedback loop 120 will appear as a low impedance load. For example, in many surveying applications, a cutoff frequency of approximately 10 Kilohertz provides satisfactory results; thus the negative feedback loop 120 is tuned to provide a lowpass filtering function having a cutoff frequency up to 10 Kilohertz. In other words, the negative feedback loop is configured to provide a low impedance load to signals less than 10 Kilohertz in frequency. If a capacitor is used to also filter high frequency components, it will be appreciated that the upper cutoff frequency will depend upon the particular application and the bandwidth of the first op-amp 110. For example, the cutoff frequency may be tuned to 1–2 Megahertz for certain surveying applications. However, as pointed out above, the circuit 100 does exhibit the same bandwidth limitations as the prior art circuits such as described with reference to FIG. 1. Accordingly, the upper cutoff frequency may be on the order of 12 Megahertz or higher.

It is worth noting that the constant bias circuit maintains a constant reverse bias across the cathode 106 and anode 104 of the light detector 102 irrespective of light current output. As such, the capacitance of the light detector 102 remains substantially constant during operation. However, even if the capacitance of the light detector 102 should change, the capacitance will not affect the impedance characteristics of the negative feedback loop 120. This is true whether the simulated inductor comprises only an inductor 122 in the negative feedback loop 120, as shown in FIG. 2, or whether the tuned circuit defined by the parallel combination of inductor 122 and capacitor 154 is used in the negative feedback loop 120, as shown in FIG. 3. This is because the negative feedback loop 120 is not connected in parallel with the light detector 102.

Figure 4:
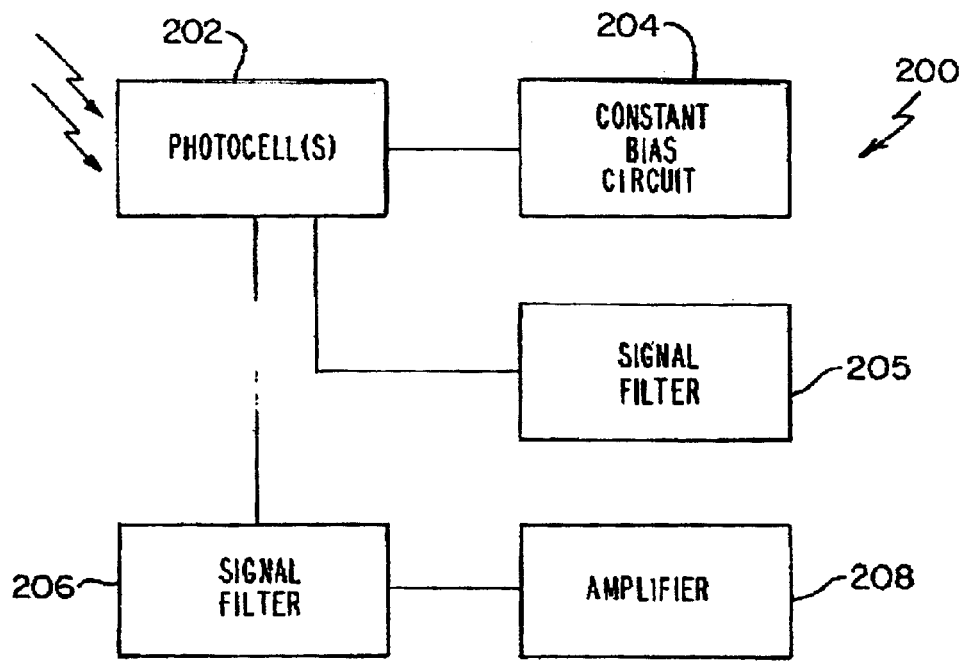
FIG. 4 is a block diagram of a receiver circuit according to one embodiment of the present invention; and, FIG. 5 is a block diagram of a receiver circuit according to another embodiment of the present invention.

Referring to FIG. 4, a light detecting system 200 comprises at least one photocell, and can include a bank or banks of photocells 202. A constant bias circuit 204 couples to the photocells 202 and keeps the photocells at a substantially constant reverse bias irrespective of the output currents generated by the photocells 202 due to the intensity of light impinging thereon. A signal filter circuit 205 is coupled to the photocells 202. The filter circuit can be any filter arranged to filter noise, ambient conditions such as daylight, and other signals of no interest. Although discussed above with reference to simple inductive and capacitive circuits, it will be appreciated that the filter circuitry can comprise higher order filters. The specific application will direct the frequency response and order of the signal filter 205. Further, the signal filter 205 need not be implemented as simple low pass and high pass filters. Again, the application will dictate which frequencies require filtering. A signal filter circuit 206 filters the output current of the photocells 202 into a signal of interest. The amplifier 208 amplifies the signal of interest for processing by other circuitry.

Figure 5:
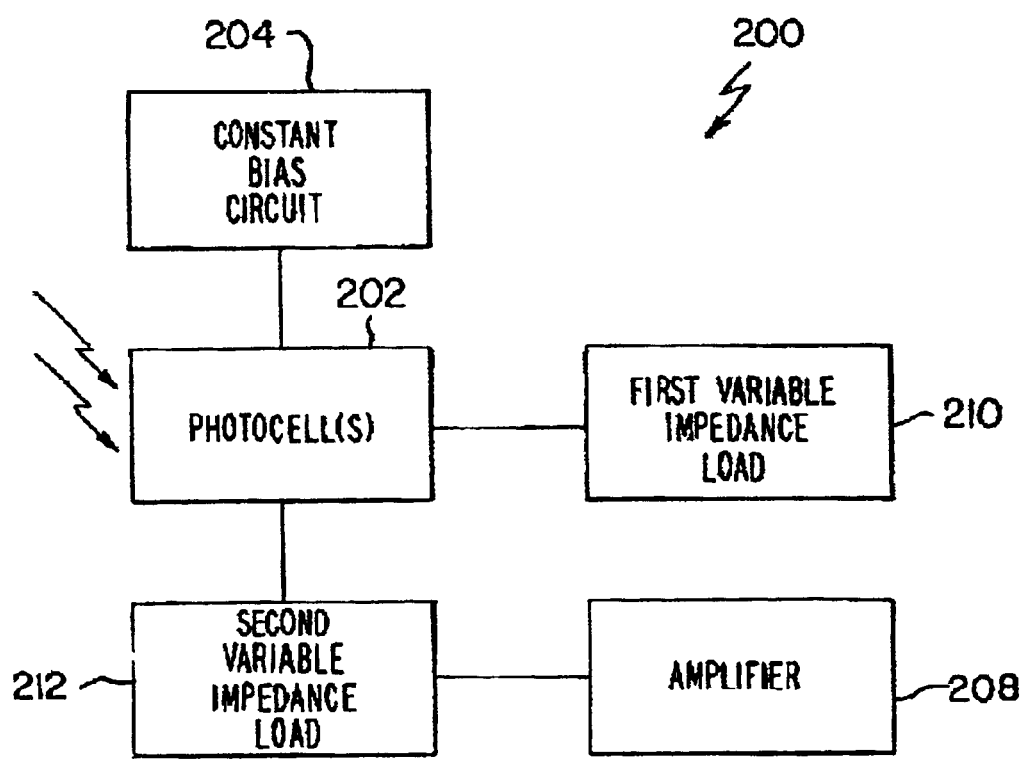

As shown in FIG. 5, where like structure is indicated with like reference, another embodiment of the light detecting system 200 is illustrated. As illustrated, the signal filter 206 of FIG. 4 is replaced with a first variable impedance load 210 and the signal filter 205 is replaced with a second variable impedance load 212. The first variable impedance load 210 provides a low impedance load to the photocells 202 when the photocells output a signal of no interest, such as a d.c. or low frequency signal. The first variable impedance load 210 further provides a high impedance load to the photocells 202 output when the photocells output a signal of interest, such that the signal of interest will not appreciably be lost to the first variable impedance load 210. The second variable impedance load 212 provides a high impedance load to signals of no interest, such as d.c. and low frequency signals, and provides a low impedance load to signals of interest such that the signals of interest are amplified by the amplifier 208.

It will be appreciated that the present invention effectively filters the effects of the daylight. Also, although shown schematically as having a single light detector, in practical applications the circuits of the present invention are scalable and can accommodate any number of light detectors or photocells.

Having described the invention in detail and by reference to preferred embodiments thereof, it will be apparent that modifications and variations are possible without departing from the scope of the invention defined in the appended claims.

What is claimed is:

1. A receiver circuit comprising:
   a light detector arranged to provide an output signal that varies based upon the intensity of light measured thereby;
   a constant bias circuit arranged to supply a reverse voltage across said light detector, said reverse voltage remaining substantially constant irrespective of said output signal;
   a signal filter coupled to said light detector arranged to filter said output signal; and;
   an amplifier arranged to amplify said output signal filtered by said signal filter.

2. A receiver circuit comprising:
   a photocell arranged to provide an output signal that varies based upon the intensity of light measured thereby;
   a first filter coupled to said photocell to filter said output signal;
   a constant bias circuit arranged to supply a reverse voltage across said photocell, said reverse voltage remaining substantially constant irrespective of said output signal; and
   an amplifier arranged to amplify said output signal of said light detector.

3. The receiver circuit according to claim 2, further comprising a plurality of photocells coupled to the constant bias circuit.

4. The receiver circuit according to claim 2, in which said first filter implements a lowpass filter.

5. The receiver circuit according to claim 4, wherein said first reference voltage is filtered by a power supply noise rejection of said first operational amplifier.

6. The receiver circuit according to claim 2, in which said first filter implements a bandpass filter.

7. The receiver circuit according to claim 2, wherein said constant bias circuit comprises a first operational amplifier having a non-inverting input coupled to a first reference voltage, and an inverting input coupled to said photocell.

8. The receiver circuit according to claim 2, in which said first
filter is configured to filter said output signal to attenuate frequencies outside a range of frequencies defining a signal of interest and substantially allow said signal of interest to couple to said amplifier.

9. The receiver circuit according to claim 2, in which said first filter has a frequency response that notches at an expected frequency range of laser light intended to be detected by said photocell; and further comprising a second filter coupled between said photocell and said amplifier configured to filter said output signal to attenuate frequencies below said expected frequency range of laser light.

* * * * *